INVENTOR.
RAYMOND COULON
BY
[signature]
AGENT

May 10, 1966 R. COULON 3,250,048

MULTIPLE ALLOYING JIGS FOR MANUFACTURING SEMICONDUCTOR DEVICES HAVING AT LEAST ONE ALLOY CONTACT EACH

Filed Aug. 18, 1964 2 Sheets-Sheet 2

INVENTOR.
RAYMOND COULON
BY Frank R. Jifani
AGENT

United States Patent Office 3,250,048
Patented May 10, 1966

3,250,048

MULTIPLE ALLOYING JIGS FOR MANUFACTURING SEMICONDUCTOR DEVICES HAVING AT LEAST ONE ALLOY CONTACT EACH

Raymond Coulon, Herouville-St.-Clair, France, assignor to North American Philips Company, Inc., New York, N.Y., a corporation of Delaware Filed Aug. 18, 1964, Ser. No. 390,329
4 Claims. (Cl. 22—58)

The invention relates to a multiple alloying jig for alloying contacts to a plurality of semiconductor bodies simultaneously, in which jig a plurality of spaces are recessed which each accommodate a semiconductor body, ducts for the contact material to be alloyed being provided which open into the said spaces. Such alloying jigs may be used in manufacturing semiconductor devices, such as transistors and diodes, having at least one alloy contact. In order to alloy such a contact to a semiconductor body, generally a pellet or grain of the contact material to be alloyed is arranged on the semiconductor material and the whole is heated to a temperature below the melting point of the semiconductor material and above the eutectic temperature of the contact and semiconductor materials. An alloying melt is produced in which part of the underlying semiconductor dissolves so that the melt penetrates into the semiconductor material to a predetermined depth.

As is known it is generally of importance for the semiconductor device to be made that the contact material is accurately located on a surface of the semicondutor body and that the alloying melt occupies a predetermined surface area of the semiconductor body and has a predetermined depth of penetration. For this purpose an alloying jig may be used in which a spaced for accommodating the semiconductor body is recessed, at least one duct for the contact material to be alloyed opening into this space.

In large-scale manufacture of semiconductor devices having alloy contacts, multiple alloying jigs are frequently used, that is to say, alloying jigs serving to manufacture a plurality of semiconductor devices by simultaneously alloying contacts to a plurality of semiconductor bodies, and the invention relates to such a multiple alloying jig.

Each space for accommodating a semiconductor body in such a jig must be proportioned so that the semiconductor body fits therein with a high degree of accuracy, and the duct must be disposed and proportioned so that the molten alloy is produced at an accurately determined location on the surface of the semiconductor body, while the melt must be prevented by the walls of the duct in the jig from spreading over the semiconductor surface beyond these walls. For this purpose care must also be taken to ensure that along the periphery of the duct the wall of the space for accommodating the semiconductor body engages the surface of the semiconductor body as closely as possible in order to prevent the melt from flowing between this wall and the semiconductor body.

With normal use of semiconductor bodies in the form of thin wafers having uniform proportions to one or both flat surfaces of which alloy contacts must be provided, the bounding surfaces of the accommodating spaces must be as flat as possible. The lateral walls of these spaces must be such that lateral displacement of the semiconductor wafers is prevented.

In a known construction such a multiple alloying jig comprises two parts having facing flat sides, recesses for accommodating the semiconductor bodies being formed in the flat surface of at least one of the said parts, and at least one duct for the contact material to be alloyed opening into each of these recesses.

It is difficult for such a recess, which may be comparatively small to be shaped so as to have exactly the desired depth and a truly flat bottom. This requires laborious mechanical operations which render the manufacture of such a jig expensive.

It is an object of the present invention to provide a multiple alloying jig which does not have the aforementioned disadvantages. According to the invention the jig comprises three members, namely two members the facing flat sides of which are provided with equal numbers of projecting portions having surfaces for engaging the upper and lower sides of the semiconductor bodies, and one intermediate plate-shaped member provided with apertures in which the projecting portions fit and which form the lateral walls of the spaces for accommodating the semiconductor bodies. By using projecting portions for bounding the upper and lower sides of the said spaces cooperating fitting surfaces can more readily be machined and polished, enabling them to be accurately matched to the flat surfaces of the semiconductor bodies. The apertures in the intermediate member may readily be made with highly accurate proportions. Especially to ensure that the projections and the semiconductor bodies accurately fit in the apertures the projections and the apertures are preferably cylindrical so that the manufacture of the alloying jig requires comparatively simple mechanical operations. Both cylindrical and square semiconductor wafers may accurately fit in such an alloying jig.

In each member provided with projections the engaging surfaces are preferably coplanar with one another. This enables both members provided with projections to be made from a plate having one truly flat surface, and furthermore all the engaging surfaces may readily be polished in one operation.

Since the alloying jig in accordance with the invention has cooperating fitting surfaces which accurately engage both sides of the semiconductor bodies to be treated, it is particularly suitable for use in alloying contacts to both sides of each semiconductor body, as is required in manufacturing so-called alloy transistors having an emitter contact and a collector contact alloyed one to either side of the semiconductor body. In such alloy transistors some of the factors determining the electrical properties are the depth of penetration of the melt for each contact, the dimension of each contact and accurate coaxial positioning of opposite contacts. For this purpose ducts for the contact material to be alloyed may be provided in the projections on both sides of the spaces for accommodating the semiconductor bodies. However, the invention is not restricted to such a jig but may advantageously be employed in processes for alloying contacts to one side only of the semiconductor bodies.

In order that the invention may readily be carried into effect, an embodiment thereof will now be described, by way of example with reference to the accompanying diagrammatic drawing, in which.

Figure 1:
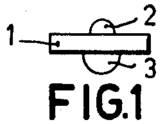
FIG. 1 is a side elevation of a semiconductor body provided with two alloy contacts.

In FIG. 1, a semiconductor body 1 made, for example, of n-type germanium is provided on the upper surface with an alloy contact 2 and on the lower surface with a slightly larger alloy contact 3. The contacts 2 and 3 may be obtained by alloying indium pellets at 550° C. to the germanium body so that rectifying junctions with the n-type germanium are produced. The body 1 provided with the contacts 2 and 3 may be used as a transistor the contact 2 being the emitter and the contact 3 the collector. For large-scale manufacture of transistors it is of importance that the contacts are positioned coaxially with one another and that the surface area of the semiconductor body occupied by each contact has a predetermined size.

Figure 2:
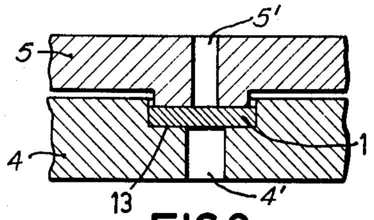
FIG. 2 is a vertical sectional view of part of a two-part multiple alloying jig of known type.

FIG. 2 shows a portion of a multiple alloying jig of known type by means of which a semiconductor body may be provided with alloy contacts as shown in FIG. 1. The jig may be made of graphite. It comprises two parts, a lower member 4 and a cover 5, which enclose recesses 13 acting as chambers for accommodating the semiconductor bodies and capable of containing a semiconductor body 1 each. The members 4 and 5 have ducts 4' and 5' respectively coaxial with one another which open into the recesses 13 and serve to supply the contact material to be alloyed for the formation of the contacts 3 and 2 respectively (FIG. 1). The material for the contact 2 may first be alloyed after which the jig is inverted and the material for the contact 3 is alloyed, the contact material being supplied through the apertures 5' and 4' respectively in the shape of pellets.

Such a known jig as shown in FIG. 2, cannot readily be manufactured with the required high degree of accuracy. It is difficult for the recesses in the member 4, which frequently must be very small, to be mechanically shaped to the required form and especially to be given truly flat polished bottoms to act as cooperating fitting surfaces for the lower surface of the semiconductor body 1. Generally such a bottom surface will show irregularities, resulting in a bad fit between this surface and the lower surface of the semiconductor body, so that in the alloying process the molten alloy may spread between the jig and the semiconductor body beyond the duct 4' with the result that the use of the jig in large-scale manufacture of semiconductor devices gives rise to unsatisfactory reproducibility and a high reject rate.

Figure 3:
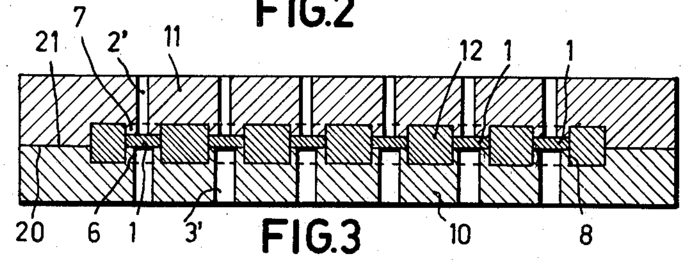
FIG. 3 is a vertical sectional view of a three-part alloying jig in accordance with the invention, a detail of which is shown in FIG. 3*a*.
Figure 3A:
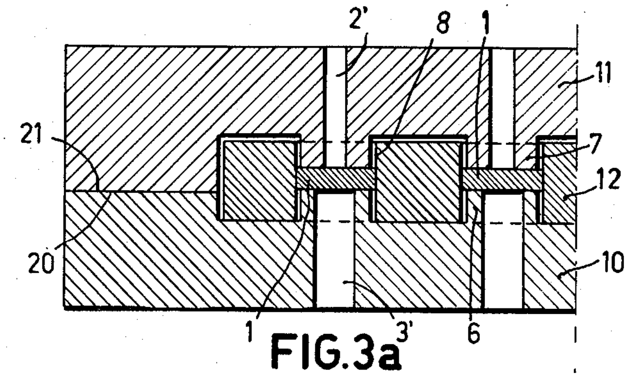
Figure 4:
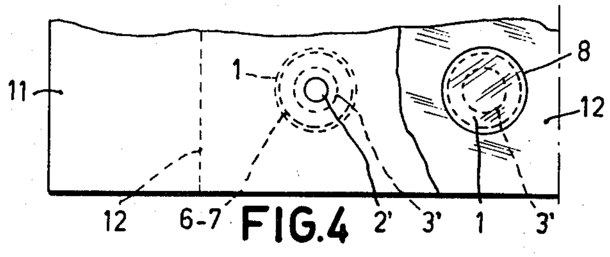
FIG. 4 is a top plan view of the detail shown in FIG. 3*a*, the upper part of the jig being partly broken away.
Figure 5:
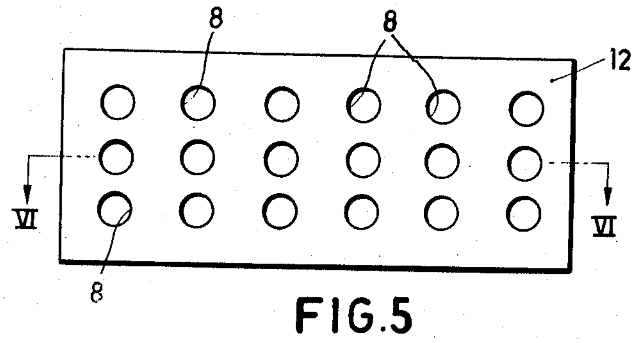
FIGS. 5 and 6 are a top plan view and a vertical sectional respectively of the middle part of the jig of FIG. 3.
Figure 6:
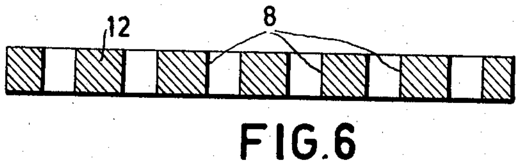
Figure 7:
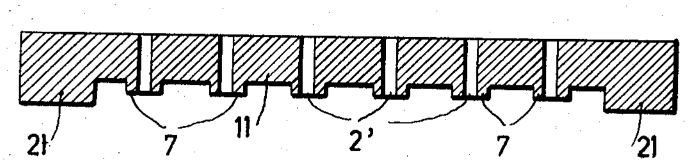
FIGS. 7 and 8 are a vertical sectional view and a bottom plan view respectively of the upper part of the jig of FIG. 3.
Figure 8:
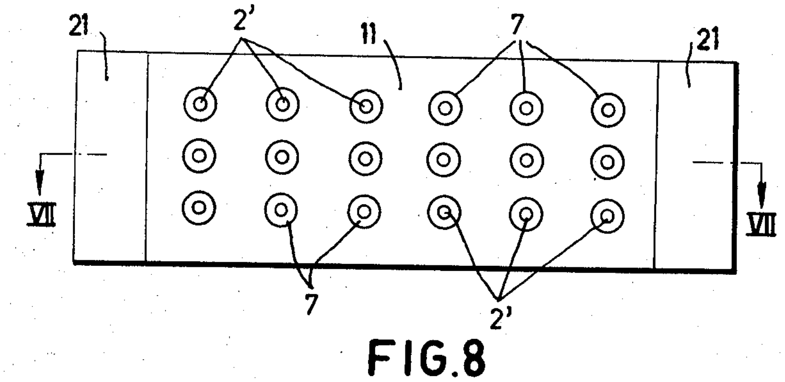

The alloying jig shown in FIG. 3 comprises 3 members, a lower member 10, an upper member or cover 11 and an intermediate plate-shaped member or grid 12. They may consist in known manner of graphite or some other refractory material which is not wetted by the molten contact material. The upper surface of the member 10 and the lower surface of the cover 11 have projecting portions 6 and 7 respectively of cylindrical shape which face one another when the jig has been assembled (for the cover 11 see FIGS. 7 and 8 also). Ducts 3' and 2' for supplying the contact material to be alloyed are provided along the axes of the projections 6 and 7 respectively. Cylindrical semiconductor bodies 1 are clamped between the end faces of the projections 6 and 7. The projections 6 and 7 further fit in cylindrical apertures or bores 8 in the grid 12 (see FIGS. 5 and 6 also). The cylindrical outer surfaces of the semiconductor bodies 1 are in close contact with the walls of the bores 8 in the grid 12, and the flat upper and lower surfaces of the semiconductor bodies 1 are in close contact with the end faces of the projections 6 and 7 of the members 10 and 11 respectively (see FIGS. 3*a* and 4 also).

The projections 6 and 7 may be produced in known manner by milling and, if required, turning-off with the aid of suitable tools. Previously, the initial surfaces of the members 10 and 11 may readily be ground flat and polished so that in each member the final end faces of the projections 6 and 7 respectively lie precisely in one plane and accurately engage the lower and upper surfaces respectively of the semiconductor bodies 1 so that in the alloying process spreading of the melt between the end faces and the surfaces of the semiconductor bodies is prevented. The ducts 3' and 2' and the bores 8 also may be accurately made by means of suitable tools. The ducts 2' and 3' may be drilled after the assembly of the jig parts so that they are accurately coaxial with one another in the facing projections.

In order to assemble the jig the grid 12 may first be secured to the lower member 10, for example, by means of bolts (not shown). The resulting assembly is similar in shape to the lower member 4 of the known alloying jig shown in FIG. 2. The semiconductor bodies 1 may now be disposed in the bores 8 of the grid 12 on the end faces of the projections 6. The lower member 10 and the cover 11 are also provided with cooperating fitting surfaces 20 and 21 respectively which are disposed so that when the cover is put into place the end faces of the projections 7 exactly engage the upper surfaces of the semiconductor bodies 1. The cover 11 may be secured to the lower member 10 with the aid of bolts (not shown).

Since the parts of the jig have shapes and proportions which may be mechanically made with a high degree of accuracy, so that for example the desired proportions of the spaces for accommodating the semiconductor bodies may be accurate to within a few microns, the use of the jig in accordance with the invention may result in a reduction of the reject rate in the large-scale manufacture of semiconductor devices. In addition, the jig in accordance with the invention may be constructed so that very small contacts may reproducibly be alloyed to very small semiconductor bodies. In a practical embodiment a three-part jig of the type shown in FIG. 3 comprises members 10 and 11 made from a sheet of graphite having a thickness of 7 mm. and a grid 12 made from a sheet of graphite having a thickness of 1.5 mm., the said jig having a length of 50 mm. and a width of 28 mm. and containing 128 chambers for accommodating semiconductor bodies. It should be noted that the jig may also be used with semiconductor bodies of, for example, rectangular or square shape, the diameters of the bores 8 being calculated in accordance with the surface diagonals of these bodies.

In manufacturing the jig conventional mechanical operations may be used with the aid of precision tools, drilling machines and surfaces grinding machines.

Obviously the invention is not restricted to the embodiment described with reference to FIGS. 3 to 8, but many modifications are possible without departing from the scope of the invention.

What is claimed is:

1. A multiple alloying jig for simultaneously alloying contacts to a plurality of semiconductive bodies, comprising an upper plate-shaped member having a plurality of passageways for contact material each passing completely through the member in a generally vertical direction, said upper member having on its bottom surface and surrounding each opening of each passageway thereat a depending projection having a planar bottom surface, a lower plate-shaped member having on its upper surface a plurality of upstanding projections each having a planar top surface aligned with but spaced from one of the projections on the upper member, said projections of the upper and lower members defining a plurality of intermediate recesses in the upper and lower members substantially aligned with one another, and an intermediate grid-like, plate-shaped member having solid portions fitted within the said recesses and openings receiving the opposing projections on the upper and lower members, said members being so related that, when semiconductive wafers are positioned in the said openings of the intermediate member, the planar surfaces of the projections on the upper member engage the top surfaces of the wafers, and the planar surfaces of the projections on the lower member engage the bottom surfaces of the wafer, and the passageways in the upper member are positioned to direct the contact material supplied from the outside to the desired sites on the surfaces of the wafers.

2. A jig as set forth in claim 1 wherein the projections and the openings are cylindrical.

3. A multiple alloying jig for simultaneously alloying contacts to opposite sides of a plurality of semiconductive wafers having opposed planar surfaces, comprising an upper plate-shaped member having a plurality of passageways for contact material each passing completely through the member in a generally vertical direction, said upper member having on its bottom surface and surrounding each opening of each passageway thereat a depending projection having a planar bottom surface, the planar bottom surfaces of all the said projections lying substantially in the same plane, a lower plate-shaped member having a plurality of passageways for contact material each passing completely through the member in a generally vertical direction, said lower member having on its upper surface and surrounding each opening of each passageway thereat an upstanding projection having a planar top surface aligned with but spaced from one of the projections on the upper member, the planar top surfaces of all the said upstanding projections lying substantially in the same plane, said projections of the upper and lower members defining a plurality of intermediate recesses in the upper and lower members substantially aligned with one another, and an intermediate grid-like, plate-shaped member having solid portions fitted within the said recesses and openings receiving the opposing projections on the upper and lower members, said three members being so related that, when semiconductive wafers are positioned in the said openings of the intermediate member, the planar surfaces of the projections on the upper member engage the top surfaces of the wafers, and the planar surfaces of the projections on the lower member engage the bottom surfaces of the wafer, and the passageways in the upper and lower members are positioned to direct the contact material supplied from the outside to the desired sites on the upper and lower surfaces of the wafers.

4. A jig as set forth in claim 3 wherein the projections and the openings are cylindrical.

References Cited by the Examiner

UNITED STATES PATENTS

| | | | |
|---|---|---|---|
| 1,607,389 | 11/1926 | Claus | 18—16.5 |
| 2,200,634 | 5/1940 | O'Koomian | 18—42 |
| 3,135,232 | 6/1964 | Fell | 22—58 |

WHITMORE A. WILTZ, *Primary Examiner.*

M. L. FAIGUS, *Assistant Examiner.*